(12) United States Patent
Yang et al.

(10) Patent No.: US 11,984,182 B2
(45) Date of Patent: May 14, 2024

(54) REPAIR SYSTEM AND REPAIR METHOD FOR SEMICONDUCTOR STRUCTURE, STORAGE MEDIUM AND ELECTRONIC DEVICE

(71) Applicant: CHANGXIN MEMORY TECHNOLOGIES, INC., Hefei (CN)

(72) Inventors: Zhi Yang, Hefei (CN); Tao Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 118 days.

(21) Appl. No.: 17/837,203

(22) Filed: Jun. 10, 2022

(65) Prior Publication Data
US 2023/0290424 A1 Sep. 14, 2023

Related U.S. Application Data

(63) Continuation of application No. PCT/CN2022/080713, filed on Mar. 14, 2022.

(30) Foreign Application Priority Data

Mar. 9, 2022 (CN) .......................... 202210226732.7

(51) Int. Cl.
*G11C 11/00* (2006.01)
*G11C 29/00* (2006.01)
(Continued)

(52) U.S. Cl.
CPC ...... *G11C 29/4401* (2013.01); *G11C 29/1201* (2013.01); *G11C 29/52* (2013.01); *G11C 29/789* (2013.01)

(58) Field of Classification Search
CPC . G11C 29/4401; G11C 29/1201; G11C 29/52; G11C 29/789
See application file for complete search history.

(56) References Cited

U.S. PATENT DOCUMENTS 6,691,264 B2 2/2004 Huang
6,728,146 B1 4/2004 Li
(Continued)

FOREIGN PATENT DOCUMENTS

CN 1469381 A 1/2004
CN 102339649 A 2/2012
(Continued)

OTHER PUBLICATIONS

First Office Action of the Taiwanese application No. 111123255, issued on Jun. 12, 2023. 7 pages with English abstract.
(Continued)

*Primary Examiner* — Pho M Luu
(74) *Attorney, Agent, or Firm* — Cooper Legal Group, LLC

(57) ABSTRACT

A repair system and a repair method for a semiconductor structure, a storage medium, and an electronic device are provided. The semiconductor structure includes a main memory area and a redundant memory area. The repair system of the present disclosure includes a test circuit, a control circuit, and a repair circuit. The test circuit is configured to perform defect detection on the main memory area to determine a failed cell of the main memory area and position information of the failed cell. The control circuit is connected to the test circuit, and is configured to store the position information of the failed cell and generate a repair signal according to the position information. The repair circuit is connected to the control circuit, and is configured to receive the repair signal and perform a repair operation on the failed cell through the redundant memory area.

18 Claims, 10 Drawing Sheets

(51) Int. Cl.
*G11C 29/12* (2006.01)
*G11C 29/44* (2006.01)
*G11C 29/52* (2006.01)

(56) References Cited

U.S. PATENT DOCUMENTS

| | | | |
|---|---|---|---|
| 9,432,298 B1* | 8/2016 | Smith | H04L 49/9057 |
| 9,741,454 B2 | 8/2017 | Lee | |
| 9,953,725 B2 | 4/2018 | Ryu | |
| 10,326,446 B2* | 6/2019 | Kim | H03K 19/003 |
| 10,559,375 B2 | 2/2020 | Shim | |
| 2002/0136066 A1 | 9/2002 | Huang | |
| 2005/0138513 A1 | 6/2005 | Mondal | |
| 2006/0253764 A1 | 11/2006 | Kobayashi | |
| 2008/0019198 A1 | 1/2008 | Co | |
| 2008/0165600 A1 | 7/2008 | Co | |
| 2009/0073788 A1 | 3/2009 | Co | |
| 2015/0135040 A1 | 5/2015 | Lee et al. | |
| 2016/0314854 A1 | 10/2016 | Lee et al. | |
| 2019/0108893 A1 | 4/2019 | Shim | |
| 2020/0143900 A1 | 5/2020 | Shim | |
| 2020/0303031 A1 | 9/2020 | Shim | |
| 2021/0158888 A1 | 5/2021 | Wieduwilt et al. | |
| 2021/0398603 A1 | 12/2021 | Wieduwilt et al. | |
| 2023/0178171 A1* | 6/2023 | Kim | G11C 29/785 365/200 |

FOREIGN PATENT DOCUMENTS

| | | |
|---|---|---|
| CN | 102420016 A | 4/2012 |
| CN | 109658973 A | 4/2019 |
| CN | 112667445 A | 4/2021 |
| CN | 112837735 A | 5/2021 |
| CN | 113127283 A | 7/2021 |

OTHER PUBLICATIONS

Supplementary European Search Report in the European application No. 22730660.2, mailed on Sep. 11, 2023. 9 pages.
First Office Action of the European application No. 22730660.2, issued on Feb. 26, 2024, 6 pages.

* cited by examiner

REPAIR SYSTEM AND REPAIR METHOD FOR SEMICONDUCTOR STRUCTURE, STORAGE MEDIUM AND ELECTRONIC DEVICE

CROSS-REFERENCE TO RELATED APPLICATION

This is a continuation application of International Patent Application No. PCT/CN2022/080713, filed on Mar. 14, 2022, which claims priority to Chinese patent application No. 202210226732.7, filed on Mar. 9, 2022 and entitled "REPAIR SYSTEM AND REPAIR METHOD FOR SEMICONDUCTOR STRUCTURE, STORAGE MEDIUM AND ELECTRONIC DEVICE". The contents of International Patent Application No. PCT/CN2022/080713 and Chinese patent application No. 202210226732.7 are incorporated by reference in their entireties.

BACKGROUND

Dynamic random access memory (DRAM) is widely used in mobile devices such as mobile phones and tablets because of its small size, high integration and fast transmission speed.

Data storage reliability is a key performance of the memory, so it is necessary to test the storage performance of the memory cells in the memory and repair the defective memory cells, thereby ensuring the storage performance of the memory. However, at present, after the failed cell is screened out, it needs to replace the failed cell according to the position of the failed cell, which is costly, time-consuming and laborious, and is easy to cause the entire dual inline memory module (DIMM) to be discarded in the disassembly and assembly process.

It should be noted that the information disclosed in the above Background section is only used to enhance the understanding of the background of the present disclosure, and therefore may include information that does not constitute the prior art known to those of ordinary skill in the art.

SUMMARY

The present disclosure relates to the field of semiconductor technology, and more particularly, to a repair system and a repair method for a semiconductor structure, a storage medium, and an electronic device.

An object of the present disclosure is to overcome the above-mentioned disadvantages of the prior art, and to provide a repair system and a repair method for a semiconductor structure, a storage medium and an electronic device, which can reduce a repair cost and improve a product yield.

According to an aspect of the present disclosure, there is provided a repair system for a semiconductor structure. The semiconductor structure includes a main memory area and a redundant memory area, and the repair system includes a test circuit, a control circuit and a repair circuit.

The test circuit is configured to perform defect detection on the main memory area to determine a failed cell of the main memory area and position information of the failed cell.

The control circuit is connected to the test circuit, and is configured to store the position information of the failed cell and generate a repair signal according to the position information.

The repair circuit is connected to the control circuit, and is configured to receive the repair signal and perform a repair operation on the failed cell through the redundant memory area.

According to an aspect of the present disclosure, there is provided a repair method for a semiconductor structure. The semiconductor structure includes a main memory area and a redundant memory area, and the repair method includes the following operations.

Defect detection is performed on the main memory area to determine a failed cell of the main memory area and position information of the failed cell.

The position information of the failed cell is stored and a repair signal is generated according to the position information.

The repair signal is received and a repair operation is performed on the failed cell through the redundant memory area.

According to an aspect of the present disclosure, there is provided a computer-readable storage medium, having stored thereon a computer program that, when being executed by a processor, implements the repair method for the semiconductor structure according to any of the above.

According to an aspect of the present disclosure, there is provided an electronic device, which includes:
one or more processors; and
a memory, configured to store one or more programs that, when being executed by the one or more processors, cause the one or more processors to implement the repair method for the semiconductor structure according to any one of the above.

It should be understood that the above general description and the following detailed description hereinafter are merely exemplary and explanatory and are not intended to limit the present disclosure.

BRIEF DESCRIPTION OF THE DRAWINGS

The drawings herein are incorporated into and form part of the description, illustrate embodiments consistent with the disclosure, and together with the description serve to explain the principles of the disclosure. It will be apparent that the drawings in the following description are merely some embodiments of the present disclosure, and other drawings may be drawn from these drawings without creative efforts by those of ordinary skill in the art.

ILLUSTRATION OF REFERENCE NUMBERS

Figure 1:
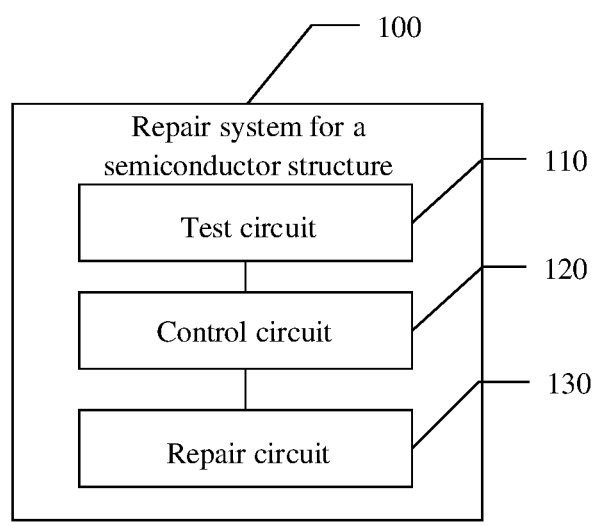
FIG. 1 is a schematic diagram of a composition of a repair system for a semiconductor structure according to an embodiment of the present disclosure.

100: Repair system; 110: Test circuit; 120: Control circuit; 130: Repair circuit; 1201: Information transmission circuit; 1202: Instruction issuing circuit; 200: Upper computer; 300: SLT test platform; 400: Repair platform.

DETAILED DESCRIPTION

Exemplary embodiments will now be described more fully with reference to the drawings. However, exemplary embodiments can be implemented in a variety of forms, and should not be construed as limited to the examples set forth herein. Rather, these embodiments are provided so that the present disclosure will be more comprehensive and complete, and the concept of example embodiments will be fully communicated to those skilled in the art. The described features, structures or characteristics may be incorporated in one or more embodiments in any suitable manner.

Further, the drawings are merely schematic illustrations of the present disclosure and are not necessarily drawn to scale. The same reference numerals in the drawings denote the same or similar parts, and thus repeated descriptions thereof will be omitted. Some of the block diagrams illustrated in the drawings are functional entities and need not necessarily correspond to physically or logically independent entities. The functional entities may be implemented in software form, in one or more hardware modules or integrated circuits, or in different networks and/or processor devices and/or microcontroller devices.

At present, after the failed cell is screened out, it needs to replace the failed cell according to the position of the failed cell, which is costly, time-consuming and laborious, and is easy to cause the entire DIMM to be discarded in the disassembly and assembly process.

Accordingly, the present disclosure provides a repair system for a semiconductor structure to solve the above technical problems. FIG. 1 illustrates a repair system 100 for a semiconductor structure of an exemplary embodiment of the present disclosure. The semiconductor structure may be a dynamic random access memory (DRAM), a static random access memory (SRAM), or the like. The repair system 100 is used to test a failed cell of a main memory area of a semiconductor structure and repair the failed cell through a redundant memory area. Referring to FIG. 1, the repair system 100 may include a test circuit 110, a control circuit 120, and a repair circuit 130.

The test circuit 110 is configured to perform defect detection on the main memory area to determine a failed cell of the main memory area and position information of the failed cell.

The control circuit 120 is connected to the test circuit, and is configured to store the position information of the failed cell and generate a repair signal according to the position information.

The repair circuit 130 is connected to the control circuit, and is configured to receive the repair signal and perform a repair operation on the failed cell through the redundant memory area.

According to the repair system 100 for the semiconductor structure of the present disclosure, defect detection is performed on the main memory area through the test circuit 110, and then a failed cell in the main memory area is identified. The control circuit 120 can generate a repair signal according to the identified failed cell. After receiving the repair signal, the repair circuit 130 can repair the failed cell through the redundant memory area. The whole repair process can be performed automatically without assembling and disassembling the semiconductor structure. The repair process does not cause damage the original semiconductor structure, the repair rate is higher, and the product yield can be improved. In addition, the repair process does not require replacement of the failed cell, and the labor cost and repair cost are lower.

In an exemplary embodiment of the present disclosure, the semiconductor structure may include a plurality of memory blocks, each including a plurality of memory cell arrays. Each memory cell array includes a plurality of memory cells distributed in an array, and data may be stored in each memory cell, thereby collectively implementing a storage function of the memory through the plurality of memory cells.

For example, the semiconductor structure may include a main memory area and a redundant memory area, the redundant memory area is distributed adjacent to the main memory area, and the main memory area and the redundant memory area each include a plurality of memory cells. In general, the memory cells in the main memory area are used to store data, the memory cells in the redundant memory area are used as a backup, the memory cells in the redundant memory area may be defined as redundant cells, that is, the redundant memory area includes a plurality of redundant cells having a storage function. When the memory cell of the main memory area is abnormal or failed, the abnormal or failed memory cell in the main memory area may be replaced with the redundant cell of the redundant memory area to complete the repair.

In an exemplary embodiment of the present disclosure, the test circuit 110 may be used to perform defect detection on a main memory area to determine a failed cell in the main memory area and position information of the failed cell. In one embodiment, the test circuit 110 may be a defect test circuit 110 in an SLT test platform, that is, the SLT test platform may be used to perform a system-level test on a main memory area of a semiconductor structure, thereby identifying a failed cell in the main memory area of the semiconductor structure and determining a specific position of the failed cell.

It should be noted that the SLT test platform may be software developed based on the system platform of the X86 structure, or may be software developed based on the system platform of the ARM structure, and the development system of the SLT test platform is not specifically limited herein.

The semiconductor structure may be connected to the SLT test platform. For example, the semiconductor structure may be inserted into the SLT test platform. The SLT test platform may automatically perform defect detection on the inserted semiconductor structure, and generate a test log. The test log may include a position of a failed particle in the semiconductor structure and address information of each failed cell within the failed particle. The position information of each failed cell may be determined by the address information.

Figure 2:
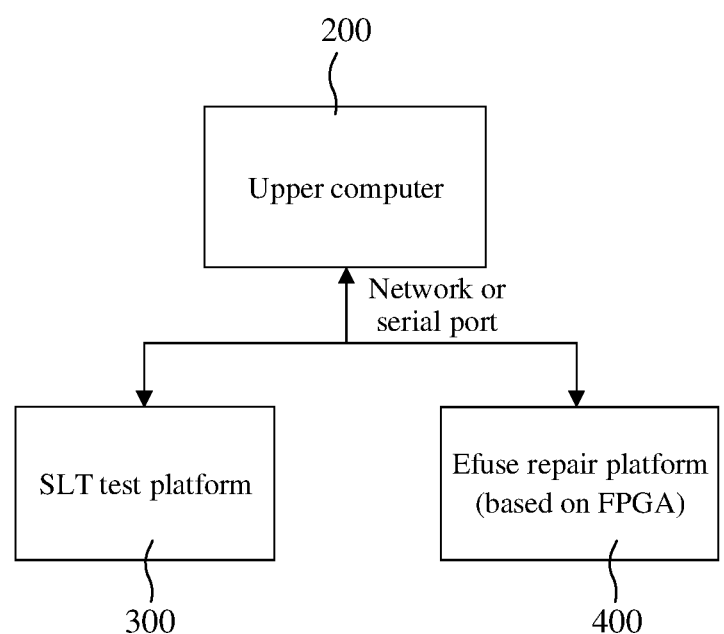
FIG. 2 is a schematic diagram of a connection of an upper computer, an system level test (SLT) test platform, and a repair platform according to an embodiment of the present disclosure.

The control circuit 120 may be connected to the test circuit 110. For example, the control circuit 120 may be provided in the upper computer 200, which may be a computer capable of directly issuing control commands. As illustrated in FIG. 2, the upper computer 200 may establish communication with the SLT test platform 300 via a serial port or a network, such that a communication connection is established between the control circuit 120 and the test circuit 110.

The control circuit 120 may have an embedded database in which the test log may be written, thereby storing position information of the failed cell through the database.

Figure 3:
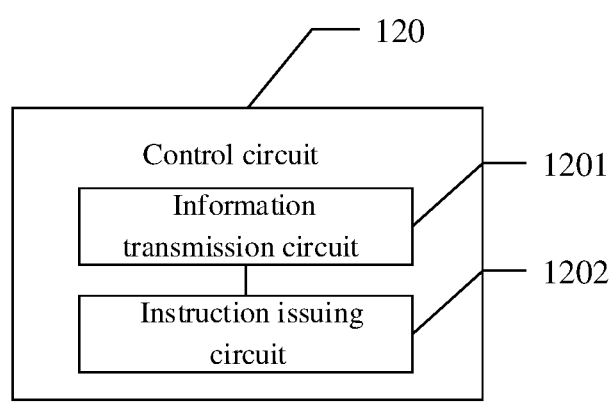
FIG. 3 is a schematic diagram of a composition of a control circuit according to an embodiment of the present disclosure.

In an exemplary embodiment of the present disclosure, as illustrated in FIG. 3, the control circuit 120 may include an information transmission circuit 1201 and an instruction issuing circuit 1202.

The information transmission circuit 1201 is connected to the test circuit 110, and is further configured to acquire the position information of the failed cell tested by the test circuit 110 through the information transmission circuit 1201. For example, the information transmission circuit 1201 may establish a communication connection with the test circuit 110 through a serial port or a network, and further perform a communication transmission to transmit the position information of the failed cell tested by the test circuit 110 to the information transmission circuit 1201 in the control circuit 120. The information transmission circuit 1201 may be an information transmission component embedded in the upper computer 200. The information transmission component may be a computer program or software. The form of the information transmission circuit 1201 is not specifically limited herein.

The SPD may be used for the purpose that the position information of the failed cell is written into the SPD. In the writing process, identification information corresponding to the position information of the failed cell may also be written so as to query or read the position information of the failed cell corresponding to the identification information through the identification information. For example, the instruction issuing circuit 1202 may issue an instruction of modifying the SPD to the FPGA board within the DIMM, and then the information of the SPD is modified through the FPGA board to write the position information of the failed cells into the SPD.

For example, the SPD may be a set of configuration information about a memory module, such as a manufacturer, a serial number, a number of physical banks (P-Banks), a number of row/column addresses, a bit width, various main operation timings, and the like, which are stored in an electrically erasable programmable read only memory (EEPROM) having a capacity of 256 bytes. That is, the timing information in the SPD is written by the module manufacturer into the EEPROM according to the characteristics of the memory chip used, and the EEPROM is stored in the memory of the upper computer 200. That is, the position information of the failed cell may be written into the SPD of the EEPROM.

In an exemplary embodiment of the present disclosure, the failed cell may have two repair states of repaired and unrepaired. When the repair state is unrepaired, the instruction issuing circuit 1202 may include an Efuse repair program that may generate a repair signal based on the position information of the failed cell and send the repair signal to the repair circuit 130. For example, the instruction issuing circuit 1202 may be an instruction issuing component embedded in the upper computer 200, and the instruction issuing component may be a computer program or software. The form of the instruction issuing circuit 1202 is not specifically limited herein.

The repair circuit 130 may be connected to the control circuit 120. For example, the repair circuit 130 may be provided in an Efuse repair platform 400 based on FPGA, and a single fuse may be programmed on a semiconductor structure through the Efuse repair platform 400.

In one embodiment, the upper computer 200 may establish communication with the Efuse repair platform 400 through a serial port or a network, such that a communication connection is established between the control circuit 120 and the repair circuit 130, such that the repair circuit 130 may receive a repair signal generated in the control circuit 120, and upon receiving the repair signal, the repair circuit 130 may automatically perform a repair operation on a failed cell, which may include replacing the failed cell with a redundant cell, thereby forming a target memory area. The repair signal may be an electrical signal or instruction information, and the type of the repair signal is not specifically limited herein.

In an exemplary embodiment of the present disclosure, the repair circuit 130 may also be used to detect a repair state of the failed cell and may transmit the detected repair state of the failed cell to the control circuit 120. When it is detected that the repair state of the failed cell is unrepaired, the control circuit 120 may automatically generate a repair signal, to control the repair circuit 130 to repair the failed cell that has not been repaired.

For example, the repair circuit 130 may be connected to the instruction issuing circuit 1202 in the control circuit 120, and the repair state of the failed cell may be transmitted to the instruction issuing circuit 1202. The instruction issuing circuit 1202 may perform redundancy analysis (i.e., RA) on the repair state of the failed cell, generate a repair signal according to the position information of the failed cell when the repair state of the failed cell is unrepaired, and send the repair signal to the repair circuit 130.

In an exemplary embodiment of the present disclosure, the repair circuit 130 may also be used to perform defect detection on the target memory area after each repair operation to determine whether a failed cell exists in the target memory area. If a failed cell exists in the target memory area, it is determined that the repair operation fails. If no failed cell exists in the target memory area, it is determined that the repair operation succeeds.

For example, the instruction issuing circuit 1202 may include a test program. When a failed cell exists in the target memory area, the test program may be used to control the SLT test platform 300 to perform a system-level test on the target memory area, so as to determine whether the failed cell exists in the target memory area. If no failed cell exists in the target memory area, it is determined that the repair operation succeeds. In this case, the preset prompt information may be sent to the control circuit 120 through the repair circuit 130, so as to remind the worker that the repair succeeds, and the defect detection is not required. The preset prompt information may be picture prompt information or voice prompt information, and the form of the preset prompt information is not specially limited herein.

In an exemplary embodiment of the present disclosure, the preset prompt information is image prompt information, and the image prompt information may be a preset model of written characters, for example, the model of written characters may be "OK" or "successful". Alternatively, it may be a preset prompt short message, for example, a short message such as "repair succeeds" or "no failed cell exists" or may be a preset picture, of course, or may be other types of prompt information, which are not listed one by one herein.

If a failed cell exists in the target memory area, it is determined that the repair is failed, and a repair operation may be performed on the failed cell in the target memory area again. For example, the position information of the failed cell may be transmitted to the control circuit 120, and the instruction issuing circuit 1202 in the control circuit 120 may generate a repair signal according to the position information of the failed cell, and send the repair signal to the repair circuit 130. The repair circuit 130 replaces the failed cell in the target memory area with the redundant cell. The cycle repeats until no failed cell is detected in the target memory area in a certain defect detection process, and the defect detection and repair operation is stopped (that is, replacing the failed cell in the target memory area with redundant cell is stopped). Alternatively, the repair operation is stopped until the number of repair operations reaches a threshold.

In an exemplary embodiment of the present disclosure, the repair system 100 of the present disclosure further includes a display, which may be a display screen configured within the upper computer 200, and may be connected to the control circuit 120, and may include a UI display interface. When the repair operation succeeds, the display may receive the preset prompt information transmitted by the control circuit 120, and may display the preset prompt information through the UI display interface, so as to remind the user that the failed cell has been repaired successfully. When the repair operation fails, the display may receive the position information of the failed cell transmitted by the repair circuit 130, and may display the position information of the failed cell on the screen through the UI display interface, so as to remind the user that the repair of the failed cell fails and the failed cell needs to be repaired again.

Figure 4:
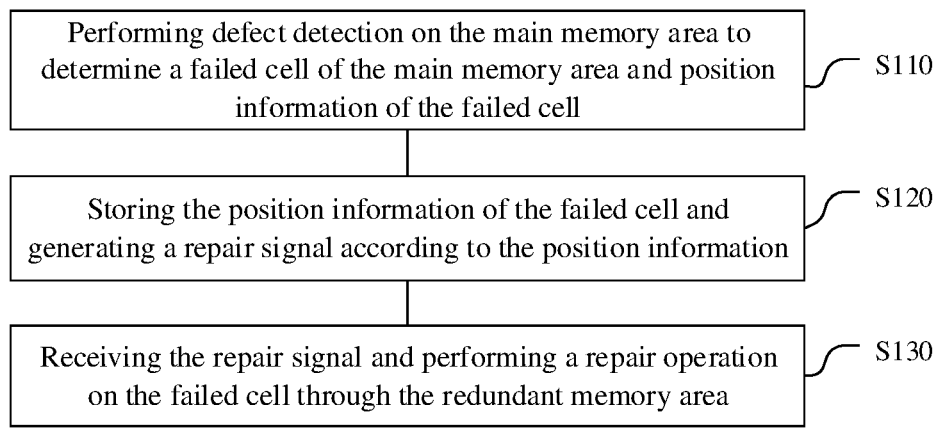
FIG. 4 is a flowchart of a repair method for a semiconductor structure according to an embodiment of the present disclosure.

Embodiments of the present disclosure also provide a repair method for a semiconductor structure. The semiconductor structure may be a dynamic random access memory (DRAM), a static random access memory (SRAM), or the like. The repair method may include operations at S110 to S130, as illustrated in FIG. 4.

At S110, defect detection is performed on the main memory area to determine a failed cell of the main memory area and position information of the failed cell.

At S120, the position information of the failed cell is stored and a repair signal is generated according to the position information.

At S130, the repair signal is received and a repair operation is performed on the failed cell through the redundant memory area.

Some details and benefits of the repair method for the semiconductor structure of the present disclosure have been described in detail in the corresponding repair system 100 for the semiconductor structure, and are not described herein again.

Figure 5:
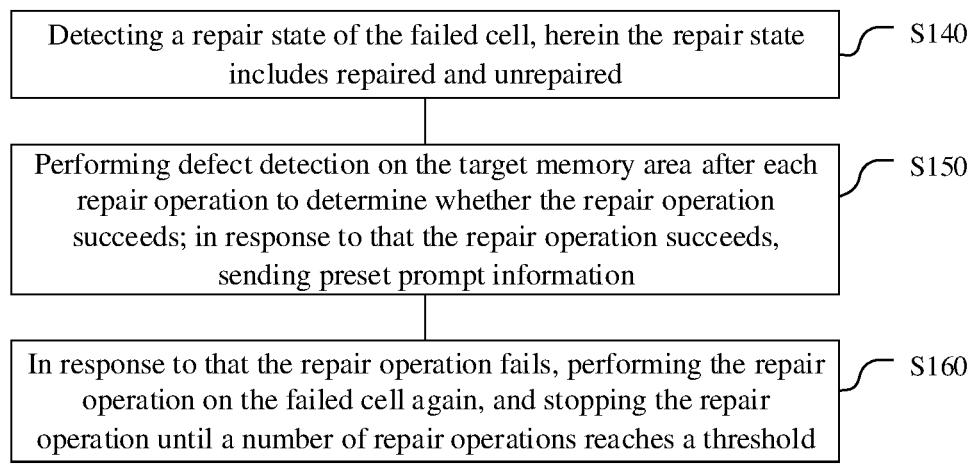
FIG. 5 is a flowchart of a repair method for a semiconductor structure according to an embodiment of the present disclosure.

In an exemplary embodiment of the present disclosure, as illustrated in FIG. 5, the repair method of the present disclosure may further include the following operations.

At S140, a repair state of the failed cell is detected, and the repair state includes repaired and unrepaired.

Figure 6:
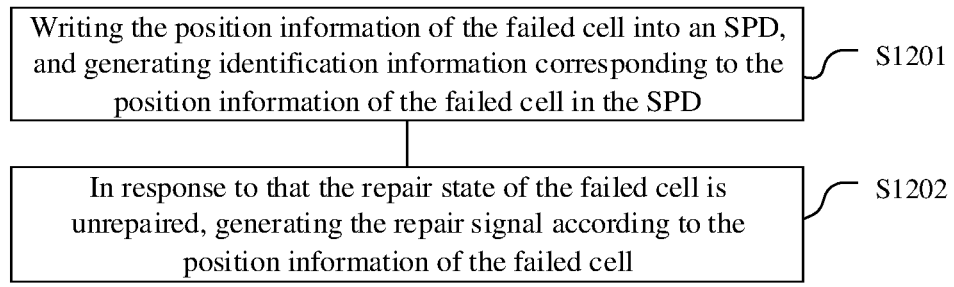
FIG. 6 is a flowchart of operation at S120 according to an embodiment of the present disclosure.

In an exemplary embodiment of the present disclosure, position information of the failed cell is stored, and a repair signal is generated based on the position information, i.e., operation at S120, which may include operations at S1201 and S1202, as illustrated in FIG. 6.

At S1201, the position information of the failed cell is written into an SPD, and identification information corresponding to the position information of the failed cell is generated in the SPD.

The SPD may be a set of configuration information about a memory module, such as a manufacturer, a serial number, a number of physical banks (P-Banks), a number of row/column addresses, a bit width, various main operation timings, and the like, which are stored in an electrically erasable programmable read only memory (EEPROM) having a capacity of 256 bytes. That is, the timing information in the SPD is written by the module manufacturer into the EEPROM according to the characteristics of the memory chip used, and the EEPROM is stored in the memory of the upper computer 200. That is, the position information of the failed cell may be written into the SPD of the EEPROM.

In the writing process, the identification information corresponding to the position information of the failed cell, the work order number, and the path corresponding to the test log may also be written into the SPD, so that the semiconductor structure corresponding to the identification information and the work order number can be quickly and accurately matched, and the position information of the failed cell corresponding to the identification information and its test path can be easily queried or read through the SPD.

At S1202, in response to that the repair state of the failed cell is unrepaired, the repair signal is generated according to the position information of the failed cell.

In an exemplary embodiment of the present disclosure, the failed cell may have two repair states of repaired and unrepaired, and in response to that the repair state is unrepaired, the repair signal may be generated according to the position information of the failed cell.

Figure 7:
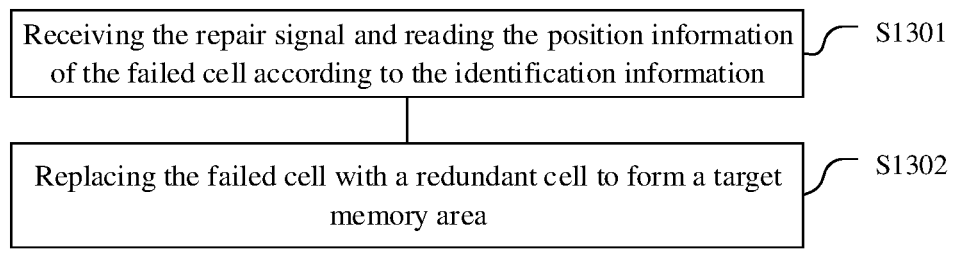
FIG. 7 is a flowchart of operation at S130 according to an embodiment of the present disclosure.

In an exemplary embodiment of the present disclosure, the repair signal is received and the repair operation is performed on the failed cell through the redundant memory area, i.e., operation at S130, which may include operations at S1301 and S1302, as illustrated in FIG. 7.

At S1301, the repair signal is received and the position information of the failed cell is read according to the identification information.

At S1302, the failed cell is replaced with the redundant cell to form a target memory area.

Upon receiving the repair signal, a repair operation may be automatically performed on the failed cell, which may include replacing the failed cell with a redundant cell, thereby forming a target memory area. The repair signal may be an electrical signal or instruction information, and the type of the repair signal is not specifically limited herein.

In an exemplary embodiment of the present disclosure, as illustrated in FIG. 5, the repair method of the present disclosure may further include the following operation.

At S150, defect detection is performed on the target memory area after each the repair operation to determine whether the repair operation succeeds; and in response to that the repair operation succeeds, preset prompt information is sent.

In an exemplary embodiment of the present disclosure, defect detection is performed on the target memory area after each repair operation to determine whether a failed cell exists in the target memory area. If a failed cell exists in the target memory area, it is determined that the repair operation fails. If no failed cell exists in the target memory area, it is determined that the repair operation succeeds.

For example, the SLT test platform 300 may be used to perform a system-level test on the target memory area, and it is further determined whether there is a failed cell in the target memory area. If there is no failed cell in the target memory area, it is determined that the repair operation succeeds. In this case, the repair circuit 130 may send preset prompt information to the control circuit 120 to remind the worker that the repair succeeds, and the defect detection is not required. The preset prompt information may be picture prompt information or voice prompt information, and the form of the preset prompt information is not specially limited herein.

In an exemplary embodiment of the present disclosure, as illustrated in FIG. 5, the repair method of the present disclosure may further include the following operation.

At S160, in response to that the repair operation fails, the repair operation is performed on the failed cell again, and the repair operation is stopped until a number of repair operations reaches a threshold.

If a failed cell exists in the target memory area, it is determined that the repair is failed, and a repair operation may be performed on the failed cell in the target memory area again. For example, the position information of the failed cell may be transmitted to the control circuit 120, and the instruction issuing circuit 1202 in the control circuit 120 may generate a repair signal according to the position information of the failed cell, and send the repair signal to the repair circuit 130. The repair circuit 130 replaces the failed cell in the target memory area with the redundant cell. The cycle repeats until no failed cell is detected in the target memory area in a certain defect detection process, and the defect detection and repair operation is stopped (that is, replacing the failed cell in the target memory area with redundant cell is stopped). Alternatively, the repair operation is stopped until the number of repair operations reaches a threshold.

Figure 8:
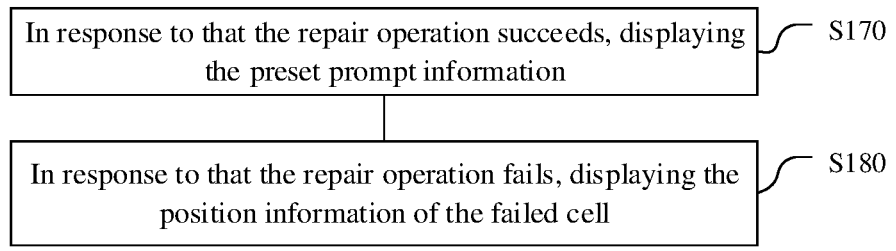
FIG. 8 is a flowchart of a repair method for a semiconductor structure according to an embodiment of the present disclosure.

In an exemplary embodiment of the present disclosure, as illustrated in FIG. 8, the repair method of the present disclosure may further include the following operations.

At S170, in response to that the repair operation succeeds, the preset prompt information is displayed.

When the repair operation succeeds, the display may receive the preset prompt information transmitted by the control circuit 120, and may further display the preset prompt information to remind the user that the failed cell has been repaired successfully.

At S180, in response to that the repair operation fails, the position information of the failed cell is displayed.

When the repair operation fails, the display may receive the position information of the failed cell transmitted by the repair circuit 130, and may display the position information of the failed cell on the screen to remind the user that the repair of the failed cell fails and the failed cell needs to be repaired again.

Figure 9:
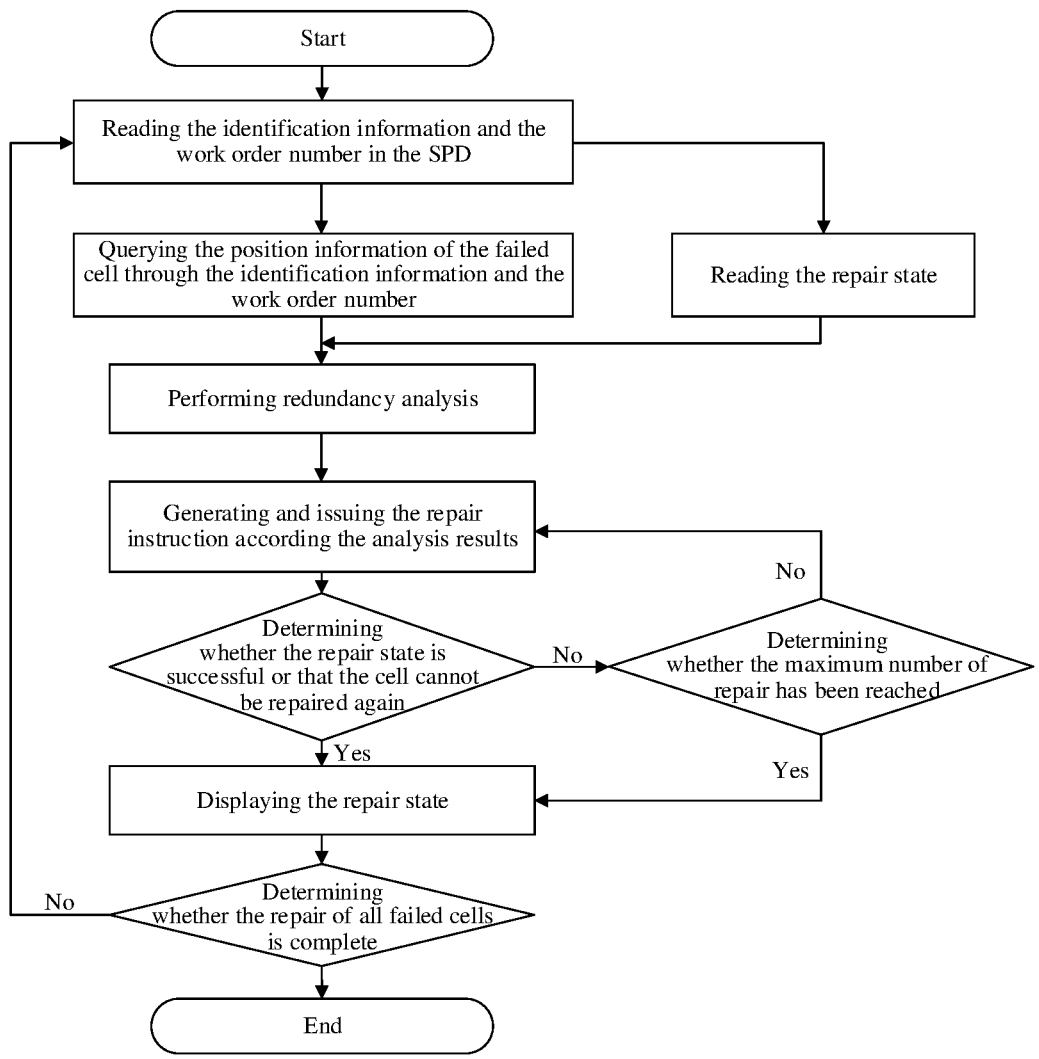
FIG. 9 is a flowchart of a repair method for a semiconductor structure according to an embodiment of the present disclosure.

A specific process of a repair method for a semiconductor structure according to an embodiment of the present disclosure is described below:

The semiconductor structure is inserted into the SLT test platform 300 to perform a system-level test. After the SLT test platform 300 completes the test, a test log including the position of the failed cell is generated automatically. The SLT test platform 300 is connected to the upper computer 200. The upper computer 200 writes the test log into the database. In the writing process, the identification information corresponding to the position information of the failed cell, the work order number, and the path corresponding to the test log are written into the SPD. As illustrated in FIG. 9, a semiconductor structure having a failed cell is inserted into an Efuse repair platform 400 developed based on the FPGA, and the Efuse repair platform 400 reads the identification information and the work order number in the database, so that the corresponding semiconductor structure can be quickly and accurately matched. At the same time, the position information of the failed cell corresponding to the identification information and a test path thereof can be easily queried or read through SPD. The upper computer 200 sends a read instruction to the Efuse repair platform 400 to read the position information of the failed cell in the main memory area of the semiconductor structure, and detect the repair state of the failed cell according to the position information of the failed cell, and perform RA on the repair state of the failed cell to determine whether the failed cell is repaired. When the repair state is repaired, the upper computer 200 displays the repair state, and the semiconductor structure is retested to determine whether all failed cells in the semiconductor structure have been repaired successfully; and if not, the semiconductor structure is inserted into the SLT test platform 300 for a new round of detection. When the repair state is unrepaired, the upper computer 200 displays the repair state, and the upper computer 200 issues the repair instruction to perform the repair operation again. The cycle repeats until no failed cell is detected in the target memory area in a certain defect detection process, and the defect detection and repair operation is stopped (that is, replacing the failed cell in the target memory area with redundant cell is stopped). Alternatively, the repair operation is stopped until the number of repair operations reaches a threshold.

It should be noted that although the steps of the repair method for a semiconductor structure of the present disclosure are described in a specific order in the drawings, this does not require or imply that these steps must be performed in this specific order, or that all of the illustrated steps must be performed to achieve the desired result. Additionally or alternatively, certain steps may be omitted, multiple steps may be combined into one step for execution, and/or one step may be decomposed into multiple steps for execution, etc.

In addition, the present disclosure also provides an electronic device capable of implementing the repair method for the above-described semiconductor structure.

Those skilled in the art will understand that various aspects of the present disclosure may be implemented as system, method, or program products. Accordingly, various aspects of the present disclosure may be embodied in the following form: a full hardware embodiment, a full software embodiment (including firmware, microcode, etc.), or an embodiment incorporating hardware and software, which may be collectively referred to herein as a "circuit", "module", or "system".

An electronic device 1000 according to such an embodiment of the present disclosure is described below with reference to FIG. 10. The electronic device 1000 illustrated in FIG. 10 is merely one example and should not be construed as limiting the functionality and scope of use of embodiments of the present disclosure.

Figure 10:
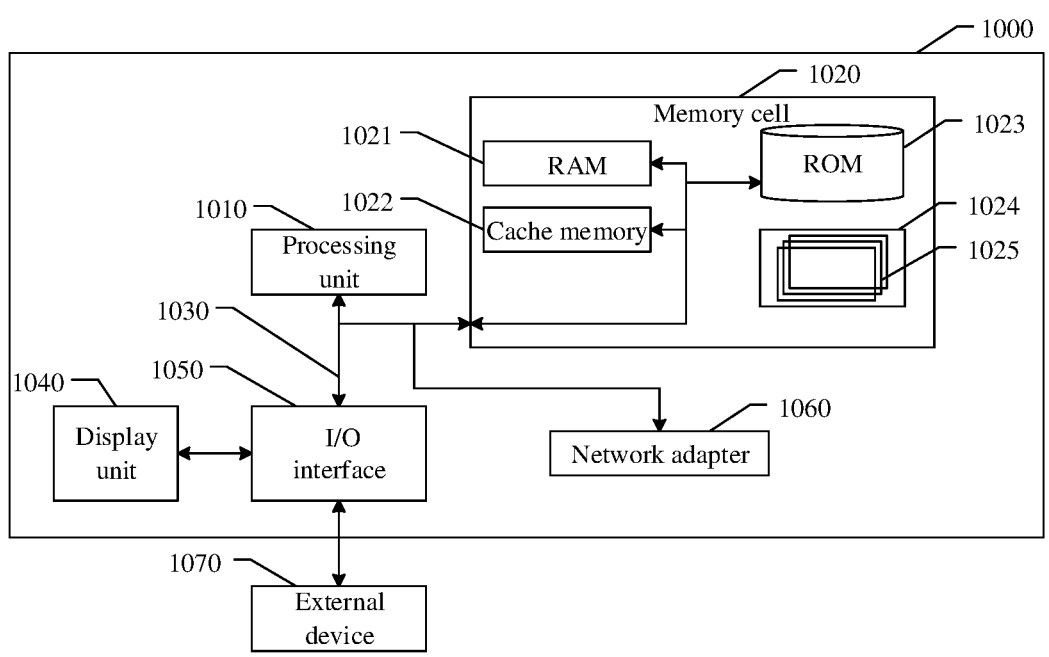
FIG. 10 is a schematic diagram of an electronic device according to an embodiment of the present disclosure.

As illustrated in FIG. 10, the electronic device 1000 takes the form of a general-purpose computing device. The components of the electronic device 1000 may include, but are not limited to, the at least one processing unit 1010, the at least one memory cell 1020, the bus 1030 connecting different system components (including the memory cell 1020 and the processing unit 1010), and the display unit 1040.

The memory cell stores program code that may be executed by the processing unit 1010 such that the processing unit 1010 performs the operations according to the various exemplary embodiments of the present disclosure described in the above-described "exemplary method". For example, the processing unit 1010 may perform: operation at S110 illustrated in FIG. 4, defect detection is performed on the main memory area to determine a failed cell of the main memory area and position information of the failed cell; operation at S120, the position information of the failed cell is stored and a repair signal is generated according to the position information; and operation at S130, the repair signal is received and a repair operation is performed on the failed cell through the redundant memory area.

As another example, the electronic device may implement the various operations illustrated in FIGS. 5 to 8.

The memory cell 1020 may include a readable medium in the form of volatile storage cells, such as random access memory (RAM) cell 1021 and/or cache memory cell 1022, and may further include read-only memory (ROM) cell 1023.

The memory cell 1020 may also include a program/utility 1024 having a set (at least one) of program module 1025, which includes, but not limited to, an operating system, one or more application programs, other program modules, and program data, each or a certain combination of which may include an implementation of a network environment.

The bus 1030 may be one or more of several types of bus structures, including a memory cell bus or memory cell controller, a peripheral bus, a graphics acceleration port, a processing unit, or a local bus using any of a variety of bus structures.

The electronic device 1000 may also communicate with one or more external devices 1070 (e.g., keyboards, pointing devices, Bluetooth devices, etc.), one or more devices that enable a user to interact with the electronic device 1000, and/or any device that enables the electronic device 1000 to communicate with one or more other computing devices (e.g., routers, modems, etc.). Such communication may be performed through an input/output (I/O) interface 1050. Also, the electronic device 1000 may also communicate with one or more networks (e.g., local area network (LAN), wide area network (WAN), and/or public networks, e.g., the Internet) through the network adapter 1060. As illustrated, the network adapter 1060 communicates with other modules of the electronic device 1000 through the bus 1030. It should be appreciated that although not illustrated, other hardware and/or software modules may be used in conjunction with the electronic device 1000, including, but not limited to, microcode, device drives, redundant processing units, external disk drive arrays, RAID systems, tape drives, and data backup storage systems.

It will be readily appreciated by those skilled in the art from the description of the embodiments above that the exemplary embodiments described herein may be implemented by software or by software in conjunction with the necessary hardware. Accordingly, the technical solution according to the embodiment of the present disclosure may be embodied in the form of a software product, which may be stored in a non-volatile storage medium (which may be a CD-ROM, a USB disk, a removable hard disk, etc.) or on a network, including several instructions to cause a computing device (which may be a personal computer, a server, a terminal apparatus, or a network device, etc.) to perform the method according to the embodiment of the present disclosure.

In an exemplary embodiment of the present disclosure, there is also provided a computer-readable storage medium having stored thereon a program product capable of implementing the above-described method of the present disclosure. In some possible embodiments, various aspects of the present disclosure may also be implemented in the form of a program product including program code for causing the terminal device to perform the steps according to the various exemplary embodiments of the present disclosure described in the above-described "exemplary method" when the program product being run on a terminal device.

A program product of an embodiment of the present disclosure for implementing the above-described method may employ a portable compact disc read only memory (CD-ROM) and include program code, and may be run on a terminal device, such as a personal computer. However, the program product of the present disclosure is not limited thereto, and in this document, the readable storage medium may be any tangible medium containing or storing a program that may be used by or in conjunction with an instruction execution system, apparatus, or device.

The program product may employ any combination of one or more readable medium. The readable medium may be a readable signal medium or a readable storage medium. The readable storage medium may be, for example, but not limited to, a system, apparatus, or device of an electrical, magnetic, optical, electromagnetic, infrared, or semiconductor, or any combination thereof. More specific examples (non-exhaustive lists) of readable storage media include electrical connections with one or more wires, portable disk, hard disk, random access memory (RAM), read-only memory (ROM), erasable programmable read-only memory (EPROM or flash memory), optical fiber, portable compact disk read-only memory (CD-ROM), optical storage devices, magnetic storage devices, or any suitable combination thereof.

A computer-readable signal medium may include a data signal propagated in a baseband or as part of a carrier wave, in which readable program code is carried. Such propagating data signal may take many forms, including but not limited to electromagnetic signal, optical signal, or any suitable combination thereof. The readable signal medium may also be any readable medium other than a readable storage medium, and the readable medium may send, propagate, or transmit a program for use by or in conjunction with an instruction execution system, apparatus, or device.

The program code contained on the readable medium may be transmitted in any suitable medium, including but not limited to wireless, wired, fiber optic cable, RF, etc., or any suitable combination thereof.

Program code for performing the operations of the present disclosure may be written in any combination of one or more programming languages, including object-oriented programming languages, such as java, C++, etc., as well as conventional procedural programming languages, such as "C" language or similar programming language. The program code may be executed entirely on the user computing device, partly on the user device, as a separate software package, partly on the user computing device and partly on the remote computing device, or entirely on the remote computing device or server. In a case of involving a remote computing device, the remote computing device may be connected to a user computing device or may be connected to an external computing device (for example, through an Internet connection with the help of an Internet service provider) through any kind of network, including a local area network (LAN) or a wide area network (WAN).

Further, the above-described drawings are merely schematic illustrations of the processes included in the method according to an exemplary embodiment of the present disclosure, and are not intended to be limiting. It is easy to understand that the processes illustrated in the above drawings do not indicate or limit the temporal order of these processes. In addition, it is also easy to understand that these processes may be performed synchronously or asynchronously, for example, in a plurality of modules.

It should be understood that the present disclosure is not limited to the precise structure already described above and illustrated in the drawings, and that various modifications and changes may be made without departing from its scope. The scope of the present disclosure is limited only by the appended claims.

Other embodiments of the present disclosure will readily be contemplated by those skilled in the art after considering the description and practicing the invention disclosed herein. The present application is intended to cover any variations, uses, or adaptations of the present disclosure that follow the general principles of the present disclosure and include well-known common knowledge or conventional technical means in the art not disclosed in the present disclosure. The description and embodiments are only considered exemplary, and the true scope and spirit of the present disclosure is indicated by the appended claims.

The invention claimed is:

1. A repair system for a semiconductor structure, wherein the semiconductor structure comprises a main memory area and a redundant memory area, and the repair system comprises:
   a test circuit, configured to perform defect detection on the main memory area to determine a failed cell of the main memory area and position information of the failed cell;
   a control circuit, connected to the test circuit, and configured to store the position information of the failed cell and generate a repair signal according to the position information; and
   a repair circuit, connected to the control circuit, and configured to receive the repair signal and perform a repair operation on the failed cell through the redundant memory area;
   wherein the repair circuit is further configured to detect a repair state of the failed cell, and the repair state comprises repaired and unrepaired.

2. The repair system of claim 1, wherein the control circuit comprises:
   an information transmission circuit, connected to the test circuit, and configured to acquire the position information of the failed cell; and
   an instruction issuing circuit, configured to issue instruction information for modifying a serial presence detect (SPD) to write the position information of the failed cell into the SPD, wherein the instruction issuing circuit is further configured to, in response to the repair state of the failed cell being unrepaired, generate the repair signal according to the position information of the failed cell and send the repair signal to the repair circuit.

3. The repair system of claim 1, wherein the redundant memory area comprises a plurality of redundant cells, and the repair operation comprises replacing the failed cell with a redundant cell of the plurality of redundant cells to form a target memory area.

4. The repair system of claim 3, wherein the repair circuit is further configured to:
   perform defect detection on the target memory area after each repair operation, and determine whether the repair operation succeeds; and
   in response to the repair operation succeeding, send preset prompt information to the control circuit.

5. The repair system of claim 4, wherein the repair circuit is further configured to, in response to the repair operation failing, perform the repair operation on the failed cell again, and stop the repair operation when a number of repair operations reaches a threshold.

6. The repair system of claim 5, further comprising:
   a display, configured to, in response to the repair operation succeeding, display the preset prompt information; and in response to the repair operation failing, display the position information of the failed cell.

7. A repair method for a semiconductor structure, wherein the semiconductor structure comprises a main memory area and a redundant memory area, and the repair method comprises:
   performing defect detection on the main memory area to determine a failed cell of the main memory area and position information of the failed cell;
   storing the position information of the failed cell and generating a repair signal according to the position information; and
   receiving the repair signal and performing a repair operation on the failed cell through the redundant memory area;
   the repair method further comprising:
   detecting a repair state of the failed cell, wherein the repair state comprises repaired and unrepaired.

8. The repair method of claim 7, wherein storing the position information of the failed cell and generating the repair signal according to the position information comprises:
   writing the position information of the failed cell into a serial presence detect (SPD), and generating identification information corresponding to the position information of the failed cell in the SPD; and
   in response to the repair state of the failed cell being unrepaired, generating the repair signal according to the position information of the failed cell.

9. The repair method of claim 8, wherein the redundant memory area comprises a plurality of redundant cells, and receiving the repair signal and performing the repair operation on the failed cell through the redundant memory area comprises:
   receiving the repair signal and reading the position information of the failed cell according to the identification information; and
   replacing the failed cell with a redundant cell of the plurality of redundant cells to form a target memory area.

10. The repair method of claim 9, further comprising:
    performing defect detection on the target memory area after each repair operation to determine whether the repair operation succeeds; and
    in response to the repair operation succeeding, sending preset prompt information.

11. The repair method of claim 10, further comprising:
    in response to the repair operation failing, performing the repair operation on the failed cell again, and stopping the repair operation when a number of repair operations reaches a threshold.

12. The repair method of claim 11, further comprising:
    in response to the repair operation succeeding, displaying the preset prompt information; and
    in response to the repair operation failing, displaying the position information of the failed cell.

13. An electronic device, comprising:
one or more processors; and
a memory, configured to store one or more programs that, when being executed by the one or more processors, cause the one or more processors to implement a repair method for a semiconductor structure;
wherein the semiconductor structure comprises a main memory area and a redundant memory area, and the repair method comprises:
performing defect detection on the main memory area to determine a failed cell of the main memory area and position information of the failed cell;
storing the position information of the failed cell and generating a repair signal according to the position information; and
receiving the repair signal and performing a repair operation on the failed cell through the redundant memory area.

14. The electronic device of claim 13, wherein the repair method further comprises:
detecting a repair state of the failed cell, wherein the repair state comprises repaired and unrepaired.

15. The electronic device of claim 14, wherein storing the position information of the failed cell and generating the repair signal according to the position information comprises:
writing the position information of the failed cell into a serial presence detect (SPD), and generating identification information corresponding to the position information of the failed cell in the SPD; and
in response to the repair state of the failed cell being unrepaired, generating the repair signal according to the position information of the failed cell.

16. The electronic device of claim 15, wherein the redundant memory area comprises a plurality of redundant cells, and receiving the repair signal and performing the repair operation on the failed cell through the redundant memory area comprises:
receiving the repair signal and reading the position information of the failed cell according to the identification information; and
replacing the failed cell with a redundant cell of the plurality of redundant cells to form a target memory area.

17. The electronic device of claim 16, wherein the repair method further comprises:
performing defect detection on the target memory area after each repair operation to determine whether the repair operation succeeds; and
in response to the repair operation succeeding, sending preset prompt information.

18. The electronic device of claim 17, wherein the repair method further comprises:
in response to the repair operation failing, performing the repair operation on the failed cell again, and stopping the repair operation when a number of repair operations reaches a threshold.

* * * * *